(12) United States Patent
Liu et al.

(10) Patent No.: US 7,235,869 B2
(45) Date of Patent: Jun. 26, 2007

(54) INTEGRATED CIRCUIT PACKAGE HAVING A RESISTANT LAYER FOR STOPPING FLOWED GLUE

(75) Inventors: Pierre Liu, Hsinchu Hsien (TW); Chen Pin Peng, Hsinchu Hsien (TW)

(73) Assignee: Kingpak Technology Inc., Hsinchu Hsien (TW)

( * ) Notice: Subject to any disclaimer, the term of this patent is extended or adjusted under 35 U.S.C. 154(b) by 119 days.

(21) Appl. No.: 10/705,386

(22) Filed: Nov. 10, 2003

(65) Prior Publication Data

US 2005/0098866 A1   May 12, 2005

(51) Int. Cl.
*H01L 23/02* (2006.01)
(52) U.S. Cl. ............... 257/678; 257/738; 257/783; 257/784
(58) Field of Classification Search ........... 257/678, 257/698, 699, 737, 738, 787, 782–784, 690, 257/713, 734, 778; 438/106, 112, 121, 124, 438/127, 118, 613, 617
See application file for complete search history.

(56) References Cited

U.S. PATENT DOCUMENTS 6,048,755 A * 4/2000 Jiang et al. .............. 438/118
6,232,551 B1 * 5/2001 Chang ..................... 174/52.4

* cited by examiner

*Primary Examiner*—Thien F Tran
(74) *Attorney, Agent, or Firm*—Pro-Techtor Int'l Services

(57) ABSTRACT

An integrated circuit package comprises a substrate having an upper surface, a lower surface, and a long slot penetrating from the upper surface to the lower surface. The lower surface is formed with a wiring regioins arranged at side of the long slot, and the wiring regions formed with a plurality of connection points. A glue layer is coated on the upper surface of the substrate and as arranged at the periphery of the long slot. The integrated circuit has a first surface formed with a plurality of bonding pads and is adhered to the glue layer. The wires, each of which is arranged within the long slot of the substrate electrically connected the bonding pads of the integrated circuit to the connection points of the substrate. The first compound layer is filled within the long slot of the substrate to protect the wires.

3 Claims, 2 Drawing Sheets

INTEGRATED CIRCUIT PACKAGE HAVING A RESISTANT LAYER FOR STOPPING FLOWED GLUE

BACKGROUND OF THE INVENTION

1. Field of the Invention

The present invention relates to an integrated circuit package having a resistant layer for stopping flowed glue, and more particularly to an integrated circuit package which may be conveniently manufactured with reduced manufacturing costs.

2. Description of the Related Art

Referring to FIG. 1, a conventional integrated circuit package having central leads includes a substrate 10, a glue layer 12, an integrated circuit 14, a plurality of wires 16, and a compound layer 18. The substrate 10 has an upper surface 20, a lower surface 22 and a long slot 24 penetrating from the upper surface 20 to the lower surface 22, wherein the lower surface 22 of the substrate 10 is formed with wiring region 26 arranged at the two sides of the long slot 24, and the wiring region 26 is formed with connection points 28. The glue layer 12 is coated on the upper surface 20 of the substrate 10, and is located at the periphery of the long slot 24. The integrated circuit 14 has a first surface 30 and a second surface 32, wherein the central portion of the first surface 30 of the integrated circuit 14 is formed with bonding pads 34, while the first surface 30 of the substrate 10 is adhered to the glue layer 12, so that the bonding pad 34 of the substrate 10 are exposed from the slot 24. The wires are arranged within the long slot 24 of the substrate 10, and electrically connect the bonding pads 34 of the integrated circuit 14 to the connection points 28 of the substrate 10. The compound layer 18 is filled within the long slot 24 to protect the wires.

However, the above-mention integrated circuit package has the following drawbacks. When the glue layer 12 is coated on the upper surface 20 of the substrate 10, the flowed glue layer 12 covers the wiring region 26 through the long slot 24 of the substrate 10, so that the connection points 28 which are arranged at the wiring region 26, are covered by flowed glue.

SUMMARY OF THE INVENTION

An object of the present invention is to provide an integrated circuit package, which is capable of preventing the flowed glue of the glue layer from covering the wiring region, so that the wire bonding is easy.

Another object of the present invention is to provide an integrated circuit package, which may be conveniently manufactured with reduced manufacturing costs.

To achieve the above-mentioned objects, the present invention provides an integrated circuit package including a substrate, a glue layer, an integrated circuit, a plurality of wires, and a first compound layer. The substrate has an upper surface, a lower surface and a long slot penetrating from the upper surface to the lower surface, wherein the lower surface is formed with wiring regions arranged at two sides of the long slot, and the wiring regions are formed with a plurality of connection points. The resistant layer is coated on and in contact with the lower surface of the substrate, and is located between the long slot and the wiring region. The glue layer is coated on the upper surface of the substrate and arranged at the periphery of the long slot. The integrated circuit has a first surface formed with a plurality of bonding pads and a second surface, wherein the first surface is adhered to the glue layer, and the bonding pads are exposed from the long slot of the substrate. The wires, each of which is arranged within the long slot of the substrate, electrically connect the bonding pads of the integrated circuit to the connection points of the substrate respectively. The first compound layer is filled within the long slot of the substrate to protect the wires.

Utilizing the resistant layer to prevent the flowed glue from covering the connection points may easily achieve the objects and functions of the invention.

DETAILED DESCRIPTION OF THE INVENTION

Figure 1:
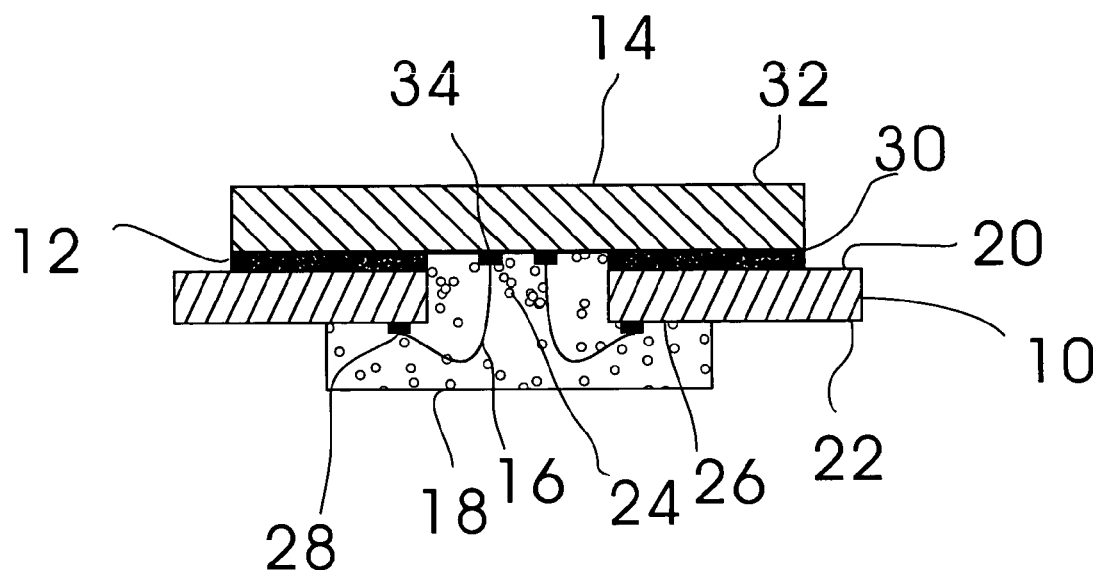
FIG. 1 is a schematic illustration showing a conventional integrated circuit package having central leads.
Figure 2:
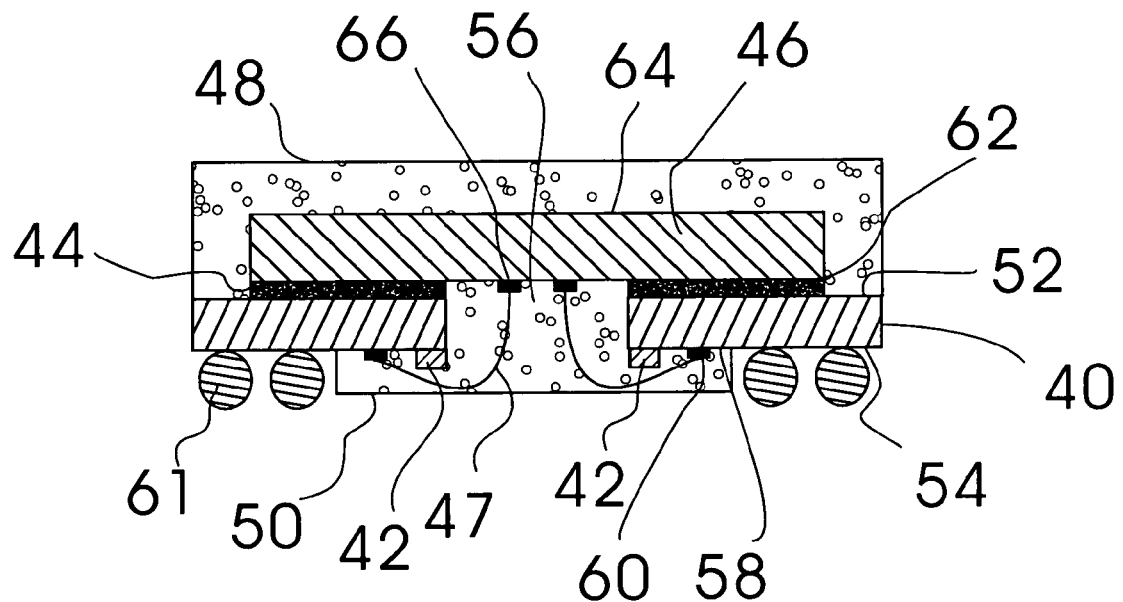
FIG. 2 is a cross-sectional view showing an integrated circuit package of the present invention.

Referring to FIG. 2, an integrated circuit package of the present invention includes a substrate 40, a resistant layer 42, a glue layer 44, an integrated circuit 46, a plurality of wires 47, a first compound layer 48, and a second compound layer 50.

Figure 3:
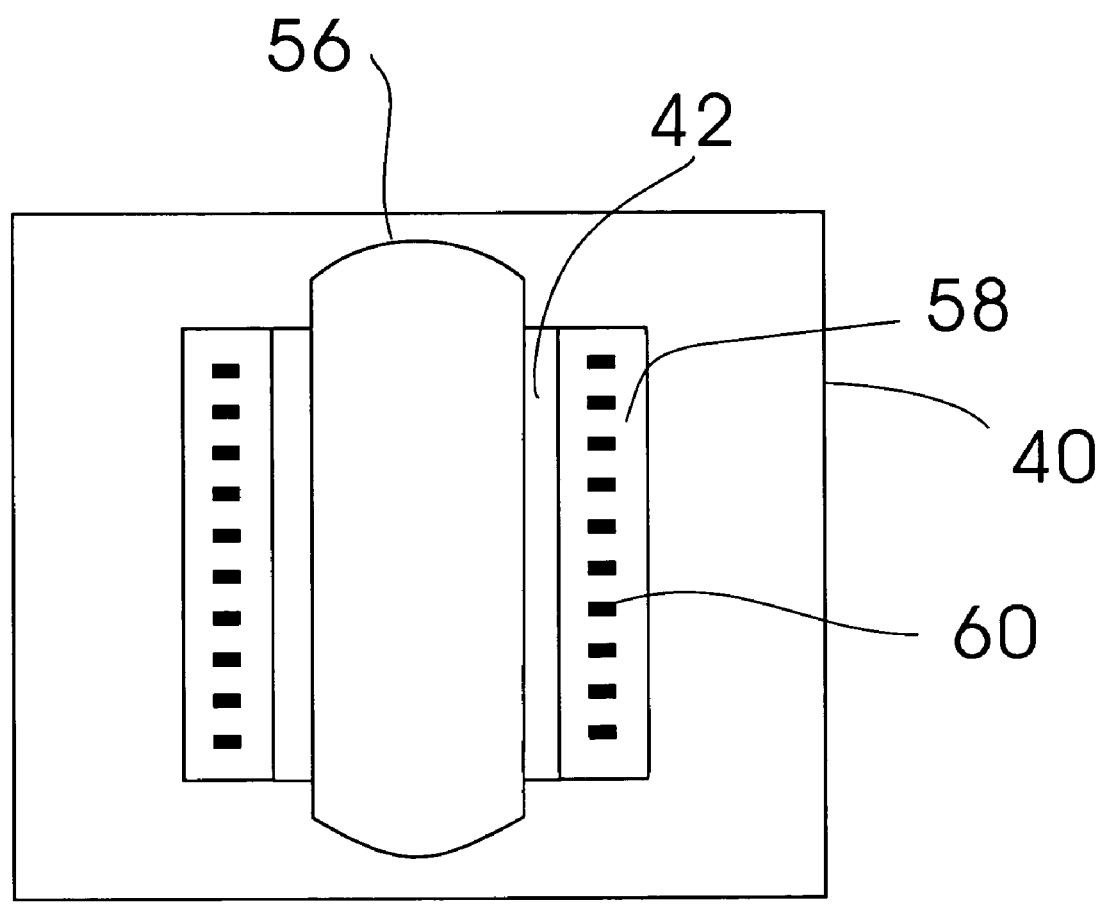
FIG. 3 is a top-view showing the substrate of the present invention.

The substrate 40 has an upper surface 52, a lower surface 54, and a long slot 56 penetrating from the upper surface 52 to the lower surface 54. The lower surface 54 of the substrate 40 is formed with wiring regions 58 arranged at the two sides of the long slot 56, and the wiring regions 58 are formed with a plurality of connection points 60, which are formed with a ball grid array. Please refer to FIG. 3, the length of the wiring region 58 is shorter than that of the long slot 56 of the substrate 40. Therefore, while the long slot 56 of the substrate is drilled, the periphery of the long slot 56 may be cracked, and the flowed glue of the glue layer 44 can not flow to the wiring region 58 via the cracked according to the resistant layer 42. The resistant layer 42 separates the long slot 56 from the wiring region 58. A length of the resistant layer 42 is substantially equal to the length of the wiring region 58.

The resistant layer 42 is coated on the lower surface 54 of the substrate 40, and is located between the long slot 56 and the wiring region 58. In the embodiment, the resistant layer 42 is made of green.

The glue layer 44 is coated on the upper surface 52 of the substrate 40, and is located at the periphery of the long slot 56.

The integrated circuit 46 has a first surface 62 on which a plurality of bonding pads 66 are formed, and a second surface 64. The first surface 62 is adhered to the glue layer 44, and the bonding pads 66 are exposed from the long slot 56 of the substrate 40.

The plurality of wires 47, each of which is arranged within the long slot 56 of the substrate 40 electrically connect the bonding pads 66 of the integrated circuit 46 to the connection points 60 of the substrate 40.

The first compound layer 48 is filled within the long slot 56 of the substrate 40 to protect each wire 47.

The second compound layer 50 is covered on the upper surface 52 of the substrate 40 to protect the integrated circuit 46.

The invention has the following advantages.

1. Since the flowed glue of the glue layer 44 flows to the lower surface 54 of the substrate 40 through the long slot 56, the resistant layer 42 prevents the flowed glue from flowing to the wiring regions 58, so that the connection points 60 cannot be covered by the flowed glue.

2. The length of each of the wiring regions 58 is shorter than that of the long slot 56. So if the substrate 40 is cracked while the long slot 56 is being drilled, the connection points 60 can be not covered by the flowed flue of the glue 44.

While the invention has been described by way of an example and in terms of a preferred embodiment, it is to be understood that the invention is not limited to the disclosed embodiment. To the contrary, it is intended to cover various modifications. Therefore, the scope of the appended claims should be accorded the broadest interpretation so as to encompass all such modifications.

What is claimed is:

1. An integrated circuit package, comprising:
   a substrate having an upper surface, a lower surface and a long slot penetrating from the upper surface to the lower surface, wherein the lower surface is formed with a wiring regions arranged at one side of the long slot, the wiring regions is formed with a plurality of connection points, and a length of the wiring regions is smaller than a length of the long slot of the substrate;
   a resistant layer, which is coated on and in contact with the lower surface of the substrate, and is located between the long slot and the wiring region, wherein the resistant layer separates the long slot from the wiring region, and a length of the resistant layer is substantially equal to the length of the wiring region;
   a glue layer coated on the upper surface of the substrate and located at a periphery of the long slot;
   an integrated circuit having a first surface formed with a plurality of bonding pads and a second surface, the first surface being adhered to the glue layer, the bonding pads being exposed from the long slot of the substrate;
   a plurality of wires, each of which is arranged within the long slot of the substrate and electrically connects the bonding pad of the integrated circuit to the connection point of the substrate; and
   a first compound layer filled within the long slot of the substrate to protect the wires.

2. The integrated circuit package according to claim 1, wherein the connection points of the lower surface of the substrate are formed with a ball grid array (BGA).

3. The integrated circuit package according to claim 1, further comprising a second compound layer, which covers the upper surface of the substrate.

* * * * *